United States Patent [19]

Lundy et al.

[11] Patent Number: 5,393,643
[45] Date of Patent: Feb. 28, 1995

[54] WATERBORNE PHOTORESISTS HAVING BINDERS NEUTRALIZED WITH AMINO ACRYLATES

[75] Inventors: Daniel E. Lundy, Pamona; Robert K. Barr, Laguna Niguel; Thanh N. Tran, Westminster, all of Calif.

[73] Assignee: Morton International, Inc., Chicago, Ill.

[21] Appl. No.: 238,133

[22] Filed: May 4, 1994

Related U.S. Application Data

[63] Continuation-in-part of Ser. No. 199,037, Feb. 18, 1994, which is a continuation-in-part of Ser. No. 186,875, Jan. 25, 1994, abandoned.

[51] Int. Cl.$^6$ ................................................ G03C 1/73
[52] U.S. Cl. ............................... 430/281; 430/906; 430/910; 522/85; 522/110
[58] Field of Search .................. 430/281, 906, 910; 522/85, 110

[56] References Cited

U.S. PATENT DOCUMENTS

| | | | |
|---|---|---|---|
| 3,929,743 | 12/1975 | Sramek | 260/80.8 |
| 4,079,028 | 3/1978 | Emmons et al. | 260/29.6 |
| 4,426,485 | 1/1984 | Hoy et al. | 524/591 |
| 4,743,698 | 5/1988 | Ruffner et al. | 549/478 |
| 4,952,481 | 8/1990 | Seio et al. | 430/284 |
| 5,045,435 | 9/1991 | Adams et al. | 430/288 |

FOREIGN PATENT DOCUMENTS 0362769  4/1990  European Pat. Off. .

*Primary Examiner*—Jack P. Brammer
*Attorney, Agent, or Firm*—Wayne E. Nacker; Gerald K. White

[57] ABSTRACT

A waterborne photoimageable composition or photoresist comprises a latex binder polymer having acid functionality to render it developable in alkaline aqueous solution, which acid functionality is neutralized to at least about 1 mole percent with an amino acrylate, a photopolymerizeable monomer fraction, and a photoinitiator chemical system.

4 Claims, No Drawings

WATERBORNE PHOTORESISTS HAVING BINDERS NEUTRALIZED WITH AMINO ACRYLATES

This is a continuation-in-part of copending application Ser. No. 08/186,037, filed on Feb. 18, 1994 which is a continuation-in-part of Ser. No. 08/186,875, filed Jan. 25, 1994, now abandoned.

The present invention is directed to photoresists, such as those used for forming printed circuit boards and more particularly to waterborne photoresists.

BACKGROUND OF THE INVENTION

Photoimageable compositions useful as resists for forming printed circuits, printing plates, solder masks or the like have been used for some time now. The earliest photoresists were solvent-borne and solvent-developable. The development of aqueous-developable resists represented an advance in reducing solvent emissions in the immediate workplace and in the general environment. The continued emphasis in reducing organic solvent both from the workplace and from the general environment has spurred the search for waterborne photoresists which are formulated and applied as aqueous liquids.

U.S. Pat. No. 5,045,435, the teachings of which are incorporated herein by reference, describes a waterborne photoresist composition which is developable in alkaline aqueous solution. The composition comprises a multifunctional monomer, a photoinitiator and a latex of water-insoluble carboxylated acrylic copolymer. To stabilize the composition and to adjust the viscosity, this patent teaches neutralizing the latex polymer to at least 25% with a base, such as ammonia, another amine, or sodium hydroxide.

In photoimageable compositions, such as described in U.S. Pat. No. 5,045,435, where ammonia, primary, secondary or tertiary amines are used to neutralize the carboxylic acid functionality of the binder, it is attempted to remove the amines during the drying process. Any residual base creates tremendous water sensitivity. As a result, the drying window using these materials is narrow. In addition, the desired volatility of the amines create potential environmental concerns and compromise the fundamental reason for waterborne coatings in the first place, i.e., non-hazardous, emission-free coatings. Moreover, when "free amines" are used for the neutralizations, strong chelate bonds can also form with the copper surface, resulting in reactivity problems developing residues and, subsequently, etch retardation.

SUMMARY OF THE INVENTION

In accordance with the invention, a waterborne photoimageable composition comprises an aqueous composition containing A) between about 30 and about 80 wt % of a latex binder polymer having an acid number of between about 40 and about 250, B) between about 15 and about 50 wt % of alpha,beta-ethylenically unsaturated monomer(s), exclusive of amino acrylates (D) below) used to neutralize acid functionality of said binder polymer A), C) between about 0.1 and about 25 wt % of a photoinitiator or photoinitiator chemical system which generates free radicals, D) between about 0.1 and about 20 wt % of an aminoacrylate so as to neutralize between about 1 and about 40 mole percent of the acid functionality of the latex binder polymer; and E) up to about 40 wt % of an additional neutralizing base and/or polyether polyurethane associate thickener in amounts sufficient to stabilize the photoimageable composition as an aqueous emulsion, the weight percentages being based on total weight of components A–E.

DETAILED DESCRIPTION OF CERTAIN PREFERRED EMBODIMENTS

Latex binder polymers useful in the photoimageable composition of the present invention are typically prepared by emulsion polymerization of alpha, beta-unsaturated monomers. Sufficient acid functional monomers are used to provide the acid number of between about 40 and about 250, preferably at least about 80. A typical emulsion polymerization procedure and some examples of suitable emulsions are found in U.S. Pat. No. 3,929,743, the teachings of which are incorporated herein by reference.

The remaining acid functionality of the binder polymer may be provided by monomers having the general formulae: $CH_2=CR^1-COO-R^2-O-SO_3H$, $CH_2=CR^1-CONH-R^2-O-SO_3H$, $CH_2=CR^1-COOH$, $CH_2=R^1-COO-R^2-OOC-R^3-COOH$, $CH_2=CR^1-COO-R^2-O-PO_3H_2$, $CH_2=CR^1-CONH-R^2-O-PO_3H_2$, and $CH_2=CR^1-CO-NH-(R^4)_q-COOH$, wherein $R^1$ is H or Me, $R^2$ is $C_1-C_6$ alkylene, $R^3$ is an $C_1-C_6$ alkylene or a phenylene group, the $R^4$s are the same or different and are selected from $CH_2$ and $CHOH$, and $q=1$ to 6.

Some specific examples of suitable acid functional monomers are acrylic acid, methacrylic acid, maleic acid, fumaric acid, citraconic acid, 2-methylpropane sulfonic acid, 2-propenoic acid, 2-methyl-2-sulfoethyl ester, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer. The acid functional monomers may be copolymerized with non-acid functional monomers, such as esters of acrylic acids, for example, methyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

To help ensure that the photoimageable composition is contact imageable, i.e., drys to a tack-free state, the glass transition temperature ($T_g$) of the latex binder polymer is preferably at least about 60° C. as measured by Differential Scanning Calorimetry (DSC) @20° C./min. The polymers have a weight average molecular weight (Mw) of between about 500 and about 200,000 as measured by gel permeation chromatography (GPS) using a polystyrene standard.

At least about 1 mole percent of the acid functionality of the binder polymer is neutralized with an amino acrylate. Total neutralization of the binder polymer is between about 1 and about 40 mole percent of the binder polymer acid functionality. Preferably, all of the acid functionality is by amino acrylates; however, the neutralization may be accomplished with a combination of amino acrylate(s) and another base, such as ammonia or a primary, secondary or tertiary amine. Amino acrylate useful in the invention have the general formula:

where
- $A = NZ_2$ where the Z's are the same or different and are selected from H, linear or branched $C_1$-$C_8$ alkanes, $C_6$-$C_{12}$ cyclic or bicyclic alkanes, phenyl or $C_1$-$C_4$ alkyl-substituted phenyl, or naphthyl or $C_1$-$C_4$ mono or di alkyl-substituted naphthyl, or
- A = N-piperidino, N-morpholino, N-picolino, N-thiazino, N-ethyleneimino, or N-propyleneimino.
- B = O, S or NZ, (or nothing when X is $(C_mH_{2m}$—O$)_n$).
- X = linear or branched $C_1$-$C_{18}$ alkanes, $C_6$-$C_{12}$ cyclic or bicyclic alkanes, phenyl or $C_1$-$C_4$ alkyl-substituted phenyl, naphthyl or $C_1$-$C_4$ mono or di alkyl-substituted naphthyl, or $(C_mH_{2m}$—O$)_n$ ) where m = 1-4 and n = 1-20.
- R = H or $C_1$-$C_8$ alkyl.

Preferred amino acrylates are tertiary aminoacrylates. Some suitable aminoacrylates include, but are not limited to N,N-diethylaminoethyl acrylate, N,N-dimethylaminoethyl methacrylate, N,N-dimethylaminopropyl methacrylate, N,N-dimethylaminopropyl acrylate, and N,N-dimethylaminoethyl acrylate.

Unlike amines heretofore used to neutralize binder polymer, the amino acrylate becomes a permanent part of the resist and is not removed during drying. Water sensitivity is avoided because the acrylate portion of the molecule polymerizes with other monomers B), rendering the amino acrylate molecules insoluble.

One surprising result of the use of amino acrylates was elimination of developing residues and etch retardation. Either the chelate bond strength has been reduced with the amino acrylate(s) or the material in the unexposed resist is more soluble in the developing solution.

Another advantage achieved by use of amino acrylates(s) is faster exposure times. The exposure time is halved in several systems. The amino group appears to be an efficient proton source during the photocure. Faster exposure times mean more boards processed per hour. In addition, faster photospeed may allow for the removal of relatively expensive photoinitiators, thereby reducing overall cost.

Another benefit of amino acrylate use is coatability. The amino acrylate has the effect in the waterborne environment of reducing micelle size and consequently reducing viscosity. Reducing viscosity means that less water need be added; accordingly higher solids levels, i.e., up to about 60 percent solids, have been achieved. As a general rule, materials have better coatability than materials with lower solids. Also drying times are reduced. In addition, materials with higher solids allow for thicker coatings which minimize pin holing and other coating defects related to thickness.

Another unexpected benefit of amino acrylate use is reduction of the tackiness of the dried resist surface. Addition of acrylate monomers generally has the opposite effect. Because the phototool is in intimate contact with the photoresist surface during exposure, the surface must be tack-free or the phototool will be damaged.

Another unexpected advantage is rapid stripping time, stripping up to three times faster being achieved.

To produce the image, this negative-acting photoimageable composition contains photopolymerizeable monomers in addition to the amino acrylate(s), particularly alpha,beta-ethylenically unsaturated monomers, including a substantial portion of multi-functional monomers. Useful monomers include those, listed above, used to form the binder polymers. Particularly suitable monomers include multi-functional acrylic monomers, such as tetraethylene glycol diacrylate (TEGDA), trimethylol propane triacrylate (TMPTA), butanediol dimethacrylate (BDDMA) and pentaerythritol triacrylate (PETA). The monomer fraction may include both water-soluble and water-insoluble monomers; however, the monomer fraction should contain a sufficiently high proportion of water-insoluble monomers(having solubilities in water at 20° C. below about 0.3 g/100 ml), e.g., above about 20 mole percent, so that the monomer fraction, as a whole, is insoluble in water.

To initiate polymerization of the monomers upon exposure to actinic radiation, the photoimageable composition contains an appropriate photoinitiator(s) or photoinitiator chemical system. Suitable photoinitiators include benzoin ethers, benzil ketals, acetophenones, benzophenones and related compounds with amines. Preferred initiators are thioxanthones, e.g., 2-isopropyl thioxanthones, particularly in conjunction with an amine.

Preferably, the waterborne photoimageable compositions include a poly(siloxane) selected from the group consisting of cyclo poly(dimethylsiloxanes), polyether modified poly(dimethylsiloxanes), poly(dimethylsiloxanes) and mixtures thereof, cyclo poly(dimethylsiloxanes) and polyether modified poly(dimethylsiloxanes) being preferred. The poly(siloxane)(s) are used at a level of between about 0.1 and about 10 wt % relative to components A)-D). Most preferably, the poly(siloxane) fraction is a mixture of cyclo poly(dimethylsiloxanes) and polyether modified poly(dimethylsiloxanes) at a weight ratio of between about 1:9 and about 9:1. An example of such a mixture is Dow Corning Q4-3667 which is an 80:20 mixture of polyether modified poly(-dimethylsiloxanes) and cyclo poly(dimethylsiloxanes). The poly(siloxanes) help to provide a tack-free surface, desirable for contact printing.

Useful poly(dimethylsiloxanes) have the general formula $(CH_3)_3$—[Si(Me)$_2$—O]$_n$—Si(CH$_3$)$_3$ where n is 0–4,000.

Cyclo poly(dimethylsiloxanes) have the general formula —[Si(Me$_2$)—O]$_n$— where n is 3 to 60.

Polyether Modified poly(dimethylsiloxanes) have the general formula:

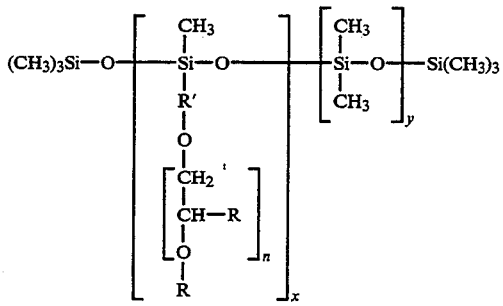

where n=0 to 1500, x=1 to 2,000, y=1 to 2000, R=H or $CH_3$ $R'=(CH_2)_{0-5}$ and the groups subscripted x and y are in random order.

Molecular weights of the poly(siloxanes) may vary over a very broad range. Low molecular poly(siloxanes) may have weight average molecular weights in the 100–600 Mw range; high molecular poly(siloxanes) may have weight average molecular weights in the 2,000 to 500,000 Mw range.

The waterborne photoimageable composition preferably includes a surfactant which is a fluoroaliphatic oxyethylene adduct at a level of between about 0.5 and about 3.0 wt % based upon the combined weights of components A)-D) above. Such surfactants have the general formula:

$$CF_3-(CF_2)_n-Y-X_m-Z;$$

where
n=0 to 20,
$Y=SO_2-N(C_1-C_{10}alkyl)$,
$X=CH_2-CH_2-O$ or $CH(CH_3)-CH_2-O$,
m=0 to 20, and
$Z=CH_2-CH_2-OH$ or $CH(CH_3)-CH_2-OH$.

Stabilization of the emulsion is provided, at least, in part, by the neutralization of the acid functional moieties of the binder polymer. As is taught in U.S. patent application Ser. No. 08/199,037, of which this application is a continuation-in-part, stabilization of the emulsion and viscosity adjustment may be assisted using a polyether polyurethane associate thickener. Polyether polyurethane thickeners are polymers having at least two hydrophobic segments which are the residues of hydrophobic isocyanates, generally isocyanates having isocyanate functionality of 2 or higher, and at least one hydrophilic polyether segment joining the hydrophobic segments by urethane linkages. The block polymers which act as associate thickener may take a variety of forms including ABA, (AB)$_n$, star polymers and the like. The polyether segments are formed from poly(alkylene oxide) segments, formed from monomers such as propylene oxide and ethylene oxide. To be sufficiently hydrophilic, generally it is necessary that at least about 3 mole percent of the poly(alkylene oxide) segment(s) be ethylene oxide residues. The hydrophobic portion of the isocyanate residue is typically an alkyl, cycloalkyl or aromatic moiety. Polyether polyurethane associate thickeners and their function are described, for example by A. J. M. Knoef, and H. Slingerland, "Urethane-Based Polymeric Thickeners for Aqueous Coating Systems" *JOCCA*, September 1992, pp 335–338; J. H. Bieleman et al. *Polymers Paint Colour Journal* 1986, V.176(4169) pp. 450–460; and A. J. Whitton and R. E. Van Doren *Polymers Paint Colour Journal* 1991, V.181(4286) pp. 374–377. Particularly suitable polyether polyurethane associate thickeners and their synthesis are described in U.S. Pat. No. 4,079,028 to Emmons et al., the teachings of which are incorporated herein by reference. Suitable polyether polyurethane associate thickeners are also described in U.S. Pat. Nos. 4,426,485 to Hoy et al. and 4,743,698 to Ruffner et al., the teaching of each of which are incorporated herein by reference. Examples of suitable commercially available associate thickeners are DSX1514 (Henkel) and QR708 (Rohm and Haas). When used, associate thickeners are used at levels of between about 1 and about 40 relative to the total weight of components A)-E) (the associate thickener comprising all or part of component E).

By using the polyether polyurethane associate thickener, less neutralization of the binder polymer latex is generally required.

In addition to the components listed above, minor amounts (generally less than about 10 wt % total based on the weight of A–E) of conventional additives may be used, including; antifoam agents, antioxidants, dyes, adhesion promoters, slip aids, and other surface tension modifiers.

In a preferred method of preparing the waterborne photoimageable composition of the present invention, those components, such as initiators, antioxidants and dyes, most compatible with a hydrophobic phase are admixed with the monomer fraction to produce a monomer base and those components most compatible with an aqueous phase with the latex polymer, such as antifoam, neutralizer surfactant and associate thickener, are admixed to form a polymer mix. The hydrophobic phase and polymer mix are blended to form an hydrophobic phase-in-water emulsion. Subsequently, high boiling solvents, surfactants, including slip aids, surface tension modifiers, and adhesion promoters are added.

The final waterborne composition is generally between about 20 and about 40 wt. percent solids. In the waterborne composition, the binder polymer (exclusive of amino acrylate(s) comprises between about 10 and about 30 wt %, amino acrylates from about 0.05 to about 10 wt %, additional monomers from about 3 to 20 wt %, initiator from about 0.3 to about 10 wt %.

Poly(siloxane(s)), when used, are typically used at between about 0.02 and about 1 wt % of the emulsified waterborne composition. If used, a fluoroaliphatic oxyethylene adduct surfactant will typically be present at between about 0.06 and about 2 wt % of the emulsified waterborne composition. Associate thickeners typically comprise between about 0.5 and about 20 wt % of the emulsified waterborne photoimageable composition.

The composition may be coated by any of the coating systems known in the art for coating solvent-borne photoimageable compositions, such as roll coating, dip coating, spray coating or curtain coating.

The compositions of the present invention are applied in a conventional manner, either as liquid compositions directly to a metal clad blank laminate or to a polymeric support sheet to form a dry film. After coating, the composition is dried to remove water and also to remove volatiles, such as ammonia or amine, water, etc., thereby rendering the solution polymer insoluble in acidic or neutral aqueous medium. As the photoimageable composition dries, the system coalesces into a continuous film. Drying is preferably carried out at somewhat elevated temperatures, both to hasten removal of the water, and to drive off the ammonia or volatile amine. Preferably, drying is carried out at a temperature of about 90° C.

In forming a dry film, a water-borne composition is applied to flexible support sheet, e.g., polyethylene terephthalate, and then dried to remove water and volatiles. Subsequently, a protective sheet, e.g., polyethylene, is applied to the photoimageable composition layer, and the dry film is rolled into reels. In drying the photoimageable composition layer, it is found desirable in some cases to leave a residual water content of between about 1 and about 2 wt. % (relative to solids of the photoimageable composition layer). This residual water acts to allow the photoimageable composition layer to conform to surface defects of a substrate, e.g., a copper-clad board, when laminated thereto.

Processing is in a conventional manner. In a typical procedure, a photoimageable composition layer, either formed from a liquid composition or transferred as a layer from a dry film, is applied to a copper surface of a copper-clad board. The photoimageable composition layer is exposed to actinic radiation through appropriate artwork. Exposure to actinic radiation polymerizes the monomer in the light-exposed areas, resulting in a cross-linked structure that is resistant to developer. Next, the composition is developed in dilute alkaline aqueous solution, such as a 1% sodium carbonate solution. The alkali solution causes salt formation with the carboxylic groups of the binder polymers, rendering them soluble and removable. After development, an etchant may be used to remove copper from those areas where the resist was removed, thereby forming a printed circuit. The remaining resist is then removed using an appropriate stripper.

Not only can waterborne primary imaging photoresists be provided in accordance with the invention, but solder mask-forming compositions can be provided as well. By solder mask is meant herein a hard, permanent layer which meets at least the minimal requirements of the abrasion resistance tests as defined in IPC-SM-840B, Table 12, Summary of Criteria for Qualification/Conformance (Institute for Interconnecting Circuits). To become hard and permanent, it is generally necessary that the photoimageable composition be curable after exposure, development and processing of the board, e.g., by thermal and/or UV curing. One way to provide a post-cure is to provide binder polymer having free —OH groups in the backbone that may be cured, for example, by cross-linking with aminoplast resins, such as melamine/formaldehyde resins and urea/formaldehyde resins. Alternatively, the photoimageable composition may contain a compatible epoxy resin and a curative for the epoxy resin. It is found that waterborne photoimageable compositions in accordance with the invention exhibit excellent shelf lives after application to copper substrates and can remain on a copper-clad board upwards of several days.

The invention will now be described in greater detail by way of specific examples.

EXAMPLE 1

Waterborne photoimageable compositions were formulated according to Table 1 below. Performance data is according to Table 2 below. "Monomer base" in Table 1 is per Table 3; all materials being mixed together, filtered and subsequently added to the aqueous portion. Table 4 is processing conditions for preparing a printed circuit board. Formulations 1 and 4 are in accordance with the invention; formulations 2 and 3 are comparative.

TABLE 1

| FORMULATION NAME | INGREDIENT TYPE | #1 | #2 | #3 | #4 |
| --- | --- | --- | --- | --- | --- |
| Neocryl CL-340 (100% solids) | carboxylic Binder | 40.0 | 40.0 | 40.0 | 40.0 |
| Dimethylaminoethyl acrylate | amino acrylate | 2.5 | 0.0 | 0.0 | 2.5 |
| DMAMP 80 | tertiary amine neutralizer | 0.0 | 2.5 | 0.0 | 0.0 |
| Ammonia | primary amine neutralizer | 0.0 | 0.0 | 2.5 | 0.0 |
| DSX-1514 (Henkel) | associative thickener | 4.5 | 4.5 | 4.5 | 4.5 |
| Deionized Water | primary solvent | 100.0 | 100.0 | 100.0 | 50.0 |
| BYK-033 (BYK/Chemie) | antifoam | 1.0 | 1.0 | 1.0 | 1.0 |
| Monomer Base | see Table #3 | 20.5 | 20.5 | 20.5 | 20.5 |
| Q4-3667 (Dow Corning) | slip aid | 0.45 | 0.45 | 0.45 | 0.45 |
| Fluorad FC170-C (3M) | surface tension modifier | 1.0 | 1.0 | 1.0 | 1.0 |
| Texanol (Eastman) | coalescing solvent | 4.5 | 4.5 | 4.5 | 4.5 |

NOTE: Ingredient weights listed in grams.
Neocryl CL-340 is a styrene/acrylic polymer having an acid number of about 160.
Q4-3667 (Dow) is an 80:20 mixture of polyether modified dimethylsiloxanes and cyclodimethylsiloxanes.
DMAMP = 2-dimethylamino-2-methyl-1-propanol

TABLE 2

| PERFORMANCE RESULTS | FORMULATION NAME | | | |
| --- | --- | --- | --- | --- |
| | #1 | #2 | #3 | #4 |
| Viscosity (initial) | 850 cps | 1790 cps | 1500 cps | 1900 Cps |
| Percent Solids | 40% | 40% | 40% | 60% |
| Emulsion Stability (1 week holding | uniform/stable | uniform/stable | phase separation | uniform/stable |
| Copper Staining (after 3 days holding) | none | very slight | severe | none |
| Alkaline Resistance | good | fair to good | fair to poor | good |
| Coating Defects | 0 voids/ft$^2$ | 0 voids/ft$^2$ | 7 voids/ft$^2$ | 0 voids/ft$^2$ |
| Coating Uniformity | no ribbing | no ribbing | slight ribbing | no ribbing |

TABLE 2-continued

| PERFORMANCE RESULTS | FORMULATION NAME | | | |
|---|---|---|---|---|
| | #1 | #2 | #3 | #4 |
| Photospeed (at 60 mj/cm2) | Copper Step 9 | Copper Step 7 | Copper Step 6.5 | Copper Step 9 |

TABLE 3

| MONOMER BASE COMPONENTS | COMPONENT TYPE | GRAMS PER FORMULA |
|---|---|---|
| Ethoxylated TMPTA (3 moles ethoxylation) | multi functional acrylate | 17.6 |
| Modaflow | flow additive | 0.05 |
| Antioxidant 2246 | antioxidant | 0.03 |
| Quantacure ITX (thioxanthone) | photosensitizer | 0.59 |
| Quantacure EPD (3° amine) | photoinitiator | 1.49 |
| Baso Blue 688 | background dye | 0.09 |
| Triphenyphosphine | antioxidant | 0.5 |
| Benzotriazole | adhesion promoter | 0.25 |

TMPTA = trimethylol propane triacrylate
PROCESSING CONDITIONS
Coating - Burkle (single sided) Roller Coater, 22 threads per inch
Substrate - Copper Clad
Exposure - HMW ORC, model 301 B, diazo art work
Development - 1% sodium carbonate monohydrate, 85° F., 2 × breakpoint
Etching - 3 normal cupric chloride, 140° F., 1.3 × minimum etch
Stripping - 3% sodium hydroxide, 130° F.
PERFORMANCE EXPLANATION
viscosity - measured on a Brookfield viscometer initially and after one week at 70° F.
Emulsion Stability - Stability was rated based on the overall uniformity of the lacquer mixture
Alkaline Resistance - the resistance was measured after alkaline etch at pH 9.2
Coating Defects - the number of coating voids (thin spots) were counted after roller coating
Coating Uniformity - the uniformity was observed immediately after coating
Photospeed - unsing a Stouffer 21 step to measure the last remaining step (each step varies by ½)
(Note: a higher step would indicate a higher degree of polymerization)
Staining - observation of the level staining on the copper surface after development

What is claimed is:

1. A photoimageable composition capable of being borne as an emulsion in an aqueous medium comprising
   A) between about 30 and about 80 wt % of a latex binder polymer having an acid number of between about 40 and about 250,
   B) between about 15 and about 50 wt % of alpha,-beta-ethylenically unsaturated monomer(s), exclusive of amino acrylates,
   C) between about 0.1 and about 25 wt % of a photoinitiator or photoinitiator chemical system which generates free radicals,
   D) between about 0.1 and about 20 wt % of an aminoacrylate(s) so as to neutralize between about 1 and about 40 mole percent of the acid functionality of the latex binder polymer; and
   E) up to about 40 wt % of an additional neutralizing base and/or polyether polyurethane associate thickener in amounts in conjunction with said aminoacrylate(s) sufficient to stabilize the photoimageable composition as an aqueous emulsion,
   the weight percentages being based on total weight of components A–E.

2. The photoimageable composition of claim 1 as an emulsion in an aqueous medium.

3. The photoimageable composition of claim 1 as a layer on a support sheet, said layer and said support sheet comprising a dry film.

4. The photoimageable composition of claim 1 wherein E) comprises a polyether polyurethane associate thickener at between about 1 and about 40 wt % based on total weight of components A–E.

* * * * *